United States Patent [19]
Huber et al.

[11] Patent Number: 5,403,753
[45] Date of Patent: Apr. 4, 1995

[54] METHOD OF FORMING IMPLANT INDICATORS FOR IMPLANT VERIFICATION

[75] Inventors: Catherine M. Huber, Allen; Debra J. Dolby, Plano; Wayland B. Holland, Garland, all of Tex.

[73] Assignee: Texas Instruments Incorporated, Dallas, Tex.

[21] Appl. No.: 92,043

[22] Filed: Jul. 15, 1993

[51] Int. Cl.⁶ ............................................. G01R 31/26
[52] U.S. Cl. .......................................... 437/8; 437/20; 250/492.22
[58] Field of Search ................. 432/7, 8, 20, 923, 924, 432/935, 981, 255; 257/48, 797, 786, 773; 148/DIG. 162

[56] References Cited

U.S. PATENT DOCUMENTS

| | | | |
|---|---|---|---|
| 4,257,825 | 3/1981 | Schaumburg | 437/8 |
| 5,051,374 | 9/1991 | Kagawa et al. | 437/8 |
| 5,106,764 | 4/1992 | Harriott et al. | 437/935 |
| 5,294,812 | 3/1994 | Hashimoto et al. | 257/65 |

*Primary Examiner*—Olik Chaudhuri
*Assistant Examiner*—Brian K. Dutton
*Attorney, Agent, or Firm*—Mark E. Courtney; Robby T. Holland; Richard L. Donaldson

[57] ABSTRACT

A semiconductor device and method of making same which includes a semiconductor substrate having a moat region with an ion implant in the moat region and a window in the substrate spaced from the moat region, electrically decoupled therefrom and having an ion implant therein in the form of a predetermined pattern. The moat region can contain one or more active and/or passive components therein. The method of fabrication comprises providing a semiconductor wafer, forming a moat region and an associated window region on the wafer, forming at least portions of electrical devices in the moat region by implanting ions therein, forming a predetermined non-electrical component pattern in the window by implanting ions in the window concurrently with the implanting of ions in the moat and completing fabrication of at least one electrical component in the moat region. Implants are verified by the above described device and selectively etching the window with an etchant selective to one of the substrate with ion implant therein and the substrate without ion implant therein to provide the pattern at a different level from the remainder of the window. The pattern is a non-electrical component pattern and the etchant is preferably selective to the portion of the window with ion implant to cause the pattern to lie below the portion of the window without ion implant.

4 Claims, 1 Drawing Sheet

METHOD OF FORMING IMPLANT INDICATORS FOR IMPLANT VERIFICATION

BACKGROUND OF THE INVENTION

1. Field of the Invention

This invention relates to implant level indicators for use in failure analysis and the like of semiconductor devices and for methods of providing such indicators.

2. Brief Description of the Prior Art

In the performance of failure analysis of semiconductor devices, reticle levels and their revisions are generally checked on the semiconductor material. Since implants do not leave an optical indicator behind, it is difficult to detect if an implant was performed. Furthermore, different implant reticle levels implant the same ions within the same substrate area. Techniques used in the prior art to distinguish between implants within an area have been a combination of various stains and the use of the scanning electron microscope (SEM), transmission electron microscope (TEM) and elemental analysis techniques such as Auger and secondary ion mass spectroscopy (SIMS). Although these are all useful failure analysis techniques, they have provided inconclusive data or are time consuming for insuring if correct implant levels were used and if all levels were implanted.

SUMMARY OF THE INVENTION

In accordance with the present invention, the above noted problems present in the prior art are minimized and there is provided an implant indicator window in each device on a wafer which provides an easier and decisive determination of whether or not an implantation occurred during fabrication of the device and if it was implanted at the correct point in the process flow.

The method includes development of reticle levels containing the implant indicator window scheme implantation into an appropriately doped moat(s) or active region(s) of the wafer being fabricated to allow the implant indicator to be easily stained and distinguished later. These indicator windows are arranged in an otherwise unused region of each device. The generated pattern levels are combined with the appropriate process to produce the device and corresponding implant indicator.

During failure analysis, each of the levels of the semiconductor device is removed individually in standard manner down to the moat or active region. At this point, the moat region and the indicator window will be at the surface. The ion implanted region can now be etched faster than the unimplanted region using an appropriate etchant which is selective to the non-ion implanted semiconductor material, such as, for example, an etchant of nitric acid: hydrofluoric acid: glacial acetic acid in the ratio 10:1:7 in conjunction with the silicon wafer for about 45 seconds. The exposed surface is etched by the above described selective etchant such that it etches the ion implanted region at a faster rate than the non-ion implanted region, leaving the original predetermined pattern in the indicator window for viewing through a microscope. The pattern will indicate the particular processing procedure utilized and show that ion implantation did take place and the intended design revision version of the implant pattern was used.

DESCRIPTION OF THE PREFERRED EMBODIMENT

Figure 1:
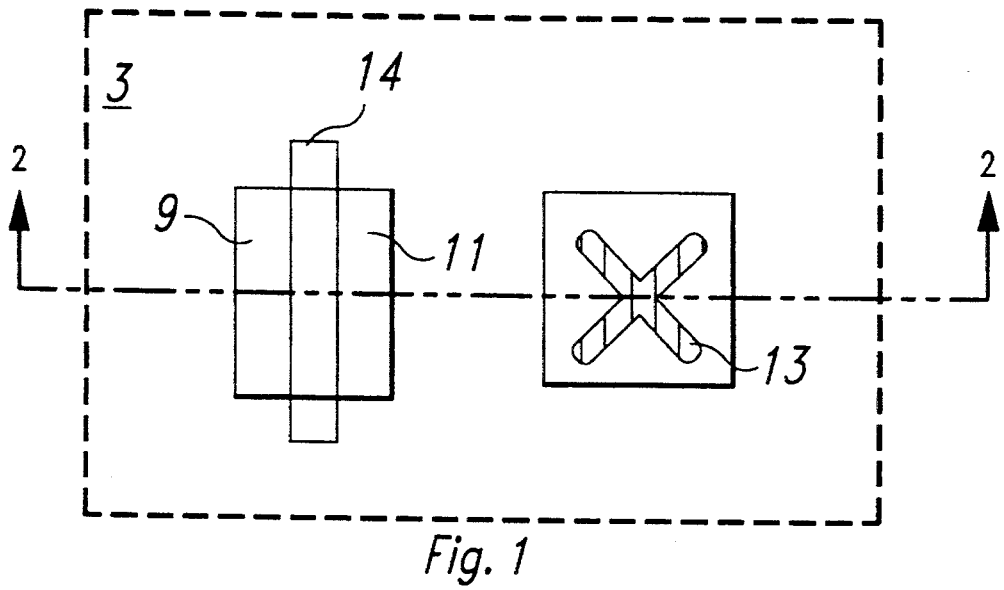
FIG. 1 is a top view of a portion of a semiconductor wafer during initial fabrication steps thereof representing a transistor and implant indicator in the standard process flow in accordance with the present invention.
Figure 2:
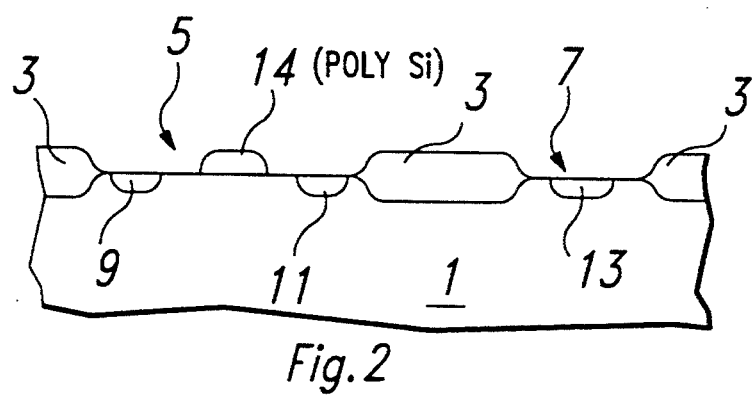
FIG. 2 is a cross-sectional view taken along the line 2—2 of FIG. 1.

Referring first to FIGS. 1 and 2, there is shown a portion of a semiconductor wafer 1 which can be composed of any semiconductor material and which will be discussed herein in terms of a silicon wafer as an example. The wafer 1 as shown is in the early stages of fabrication of semiconductor devices thereon. It is understood that one or more devices will be fabricated on the wafer in standard manner.

The wafer 1 includes a patterned field oxide 3 at the surface region thereof defining the moat or active region 5 of each device and a window region 7 associated with each moat region which will be discussed in more detail hereinbelow. It is understood that there can be plural moat regions on the single chip which are all of the type described herein or different from each other. The moat region 5 and window region 7 extend to the surface of the wafer 1 at the state of fabrication shown in FIGS. 1 and 2. Ion implantation now takes place to form active and/or passive elements in the moat region 5, such ion implantation being shown in FIGS. 1 and 2 as source and drain regions 9 and 11 of a FET merely by way of example. Concurrently with the formation of the source and drain regions 9 and 11, a predetermined pattern 13 will be formed in the window region 7 by the ion implant, this being shown in FIG. 1 as an "X". Device fabrication then continues in standard manner to completion of the desired device or devices on the wafer 1, such as, for example, with the addition of a polysilicon gate region 14 over an oxide layer (not shown), with appropriate subsequent testing, scribing and packaging then taking place. It should be understood that the moat region 5, after completion of the fabrication procedure, can include one or more active and/or one or more passive electrical components to provide individual circuit elements or a complete integrated circuit. The completed device will be identical to those of the prior art except that it will also include the window region 7 with implant in the form of a predetermined pattern 13 at an otherwise unused portion of each device.

During failure analysis, each of the layers of the fabricated semiconductor device deposited, sputtered or grown onto the wafer during fabrication are removed in standard manner until the moat regions 9 and 11 and window region 7 are exposed at the surface as shown in FIGS. 1 and 2. The field oxide 3 can optionally have been removed at this time also.

Figure 3:
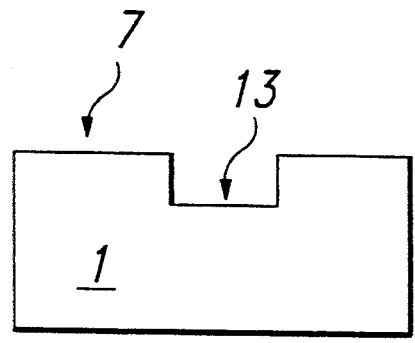
FIG. 3 is a cross-sectional view taken along the line 3—3 of FIG. 4 of the window region with etched pattern thereon after deprocessing in accordance with the present invention.
Figure 4:
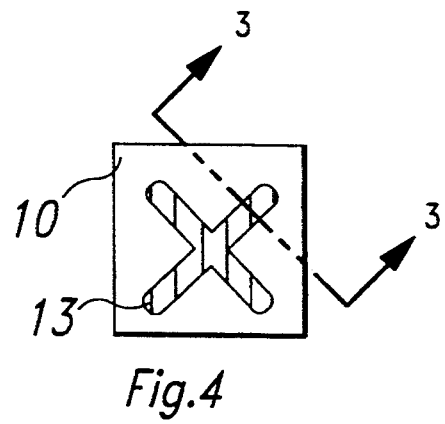
FIG. 4 is a top view of the window region with etched pattern thereon after deprocessing as in FIG. 3.

Etching now takes place with an etchant which is selective to the non-ion implanted wafer material relative to the ion implanted wafer material. In the case of the silicon wafer 1, the etchant applied to the wafer surface is nitric acid: hydrofluoric acid: glacial acetic acid in the ratio 10:1:7, this etchant being applied to the wafer for 45 seconds. The result is, as shown in FIGS. 3 and 4, that the pattern 13 will be etched at a faster rate than the wafer portion within the window 7 surrounding the pattern. This will cause the pattern 13 to be lower than the surrounding wafer portion within the window 7 and permit the pattern to be detected under a microscope. The pattern provides the desired information as to whether or not an implantation occurred during fabrication of the device and if it was implanted with the correct implant reticle.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modification.

We claim:

1. A method of making a semiconductor device, comprising the steps of:
   (a) providing a semiconductor wafer;
   (b) forming on said semiconductor wafer a plurality of moat regions and a plurality of window regions, one said window region uniquely associated with one said moat region;
   (c) forming at least portions of electrical components in each said moat region by implanting ions therein;
   (d) forming a non-electrical component pattern in each said window region by implanting ions in each said window region in the shape of said pattern concurrently with said implanting of ions in step (c), each said moat region and associated window region defining a semiconductor device under fabrication; and
   (e) completing fabrication of a semiconductor device including a said moat region and containing said window region with non-electrical component pattern.

2. The method of claim 1 wherein each said moat region contains at least one of active and passive electrical components therein.

3. The method of claim 1 wherein each said moat region contains plural active electrical components therein.

4. A method of making semiconductor devices, comprising the steps of:
   (a) providing a semiconductor wafer;
   (b) forming on said semiconductor wafer a plurality of moat regions and a plurality of window regions, each said window region adjacent and uniquely associated with one of said moat regions;
   (c) forming at least portions of electrical components in said moat regions by implanting ions therein;
   (d) forming a pattern in each said window region by implanting ions in each said window region in the shape of said predetermined pattern concurrently with said implanting of ions in step (c), each said moat region and associated window region in combination defining a semiconductor device under fabrication; and
   (e) completing fabrication of said semiconductor devices, each semiconductor device including a said moat region and associated window region with said pattern.

* * * * *